United States Patent [19]

Schnapper

[11] Patent Number: 5,193,348
[45] Date of Patent: Mar. 16, 1993

[54] DEVICE FOR COOLING A SQUID MEASURING INSTRUMENT

[75] Inventor: Christoph Schnapper, Erlangen, Fed. Rep. of Germany

[73] Assignee: Siemens Aktiengesellschaft, München, Fed. Rep. of Germany

[21] Appl. No.: 720,203

[22] Filed: Jun. 24, 1991

[30] Foreign Application Priority Data

Jun. 25, 1990 [EP]  European Pat. Off. ........ 90112052.7
Dec. 7, 1990 [DE]  Fed. Rep. of Germany ....... 4039129

[51] Int. Cl.$^5$ ...................... G01R 33/02; F25B 19/00
[52] U.S. Cl. ..................................... 62/51.1; 62/50.1; 62/50.7; 324/248; 505/1; 505/888; 505/899
[58] Field of Search ...................... 62/50.1, 50.7, 51.1; 324/248; 505/1, 888, 899; 138/112

[56] References Cited

U.S. PATENT DOCUMENTS

| | | | |
|---|---|---|---|
| 3,565,118 | 2/1971 | Stearns | 138/112 |
| 3,882,687 | 5/1975 | Asztalos | 505/899 X |
| 3,980,076 | 9/1976 | Wikswo, Jr. et al. | 324/248 X |
| 4,492,088 | 1/1985 | Ibrahim et al. | 505/888 X |
| 4,492,089 | 1/1985 | Rohner et al. | 62/50.7 |
| 4,543,794 | 10/1985 | Matsutani et al. | 62/54 |
| 4,692,560 | 9/1987 | Hotta et al. | 62/50.7 X |
| 4,745,760 | 5/1988 | Porter | 62/50.7 X |
| 4,749,946 | 6/1988 | Hoenig | 324/248 |
| 4,827,217 | 5/1989 | Paulson | 324/248 |
| 4,870,830 | 10/1989 | Hohenwarter et al. | 62/50.7 |
| 4,987,368 | 1/1991 | Vinegar | 324/303 |
| 4,996,479 | 2/1991 | Hoenig | 324/248 |
| 5,061,681 | 10/1991 | Paulson et al. | 324/248 X |
| 5,081,071 | 1/1992 | Hirschkoff | 505/1 |

FOREIGN PATENT DOCUMENTS

| | | |
|---|---|---|
| 0111827 | 4/1987 | European Pat. Off. . |
| 0361137 | 4/1990 | European Pat. Off. . |
| 3427601 | 4/1988 | Fed. Rep. of Germany . |
| 2622977 | 5/1989 | France . |
| WO85/04489 | 10/1985 | World Int. Prop. O. . |
| 8912833 | 12/1989 | World Int. Prop. O. ......... 324/248 |

OTHER PUBLICATIONS

Proceedings of the 5th Cryocooler Conference, Monterey, Calif., 1988, pp. 35–46; D. S. Buchanan et al. "Development of a Hybrid Gifford-McMahon Joule-Thompson Based Neuromagnetometer Cryosquid".
Patent Abstracts of Japan, vol. 6, No. 140, Jul. 29, 1982; & JP-A-57 64 906, Apr. 20, 1982.
J. Phys. E: Sci. Instr., vol. 13 (1980), pp. 801–813.
IEEE Transactions on Electrondevices, vol. ED-27, No. 10 (Sep. 1980), pp. 1896–1908.
"Biomagnetism", Proceedings of Third International Workshop on Biomagnetism, Berlin, May 1980 (1981), pp. 3–31.
Linde Berichte Aus Technik und Wissenschaft: "Der Linde-Refrigerator fur die Kernspintomographie", vol. 64, (Sep. 1990), pp. 38–45.
Advances in Cryogenic Engineering, vol. 35, (Sep. 1990) "Helium Liquefaction by a Gifford-McMahon Cycle Cryocooler", Nagao et al., pp. 1251–1260.
Cryogenics: "Interfacing Small Closed-Cycle Refrigerators to Liquid Helium Cryostats", (Sep. 1984), R. C. Longsworth, pp. 175–178.
"E & M" (Jun. 1973): Technische Anwendungen der Supraleitung—Kalteleistungsaufwand, F. X. Eder, 218–224.
Derwent Abstract JA-0078983, Mar. 1990.

Primary Examiner—Henry A. Bennet
Assistant Examiner—Chris Kilner
Attorney, Agent, or Firm—Kenyon & Kenyon

[57] ABSTRACT

A device for cooling a SQUID measuring instrument for measuring biomagnetic or other weak magnetic fields includes a cryostat containing a vacuum in an interior space. At least one superconducting gradiomeer and at least one associated SQUID are disposed in the vacuum. Heat-conducting connections thermally couple the superconducting gradiometer and the associated SQUID to a cryogen supplied from outside the cryostat. A carrier structure supports the SQUID and the gradiometer. The carrier structure has cooling channels through which the cryogen is forced. A cryogen supply unit is situated outside the cryostat and a cryogen transfer line couples the cryogen supply unit to the cooling channels.

30 Claims, 5 Drawing Sheets

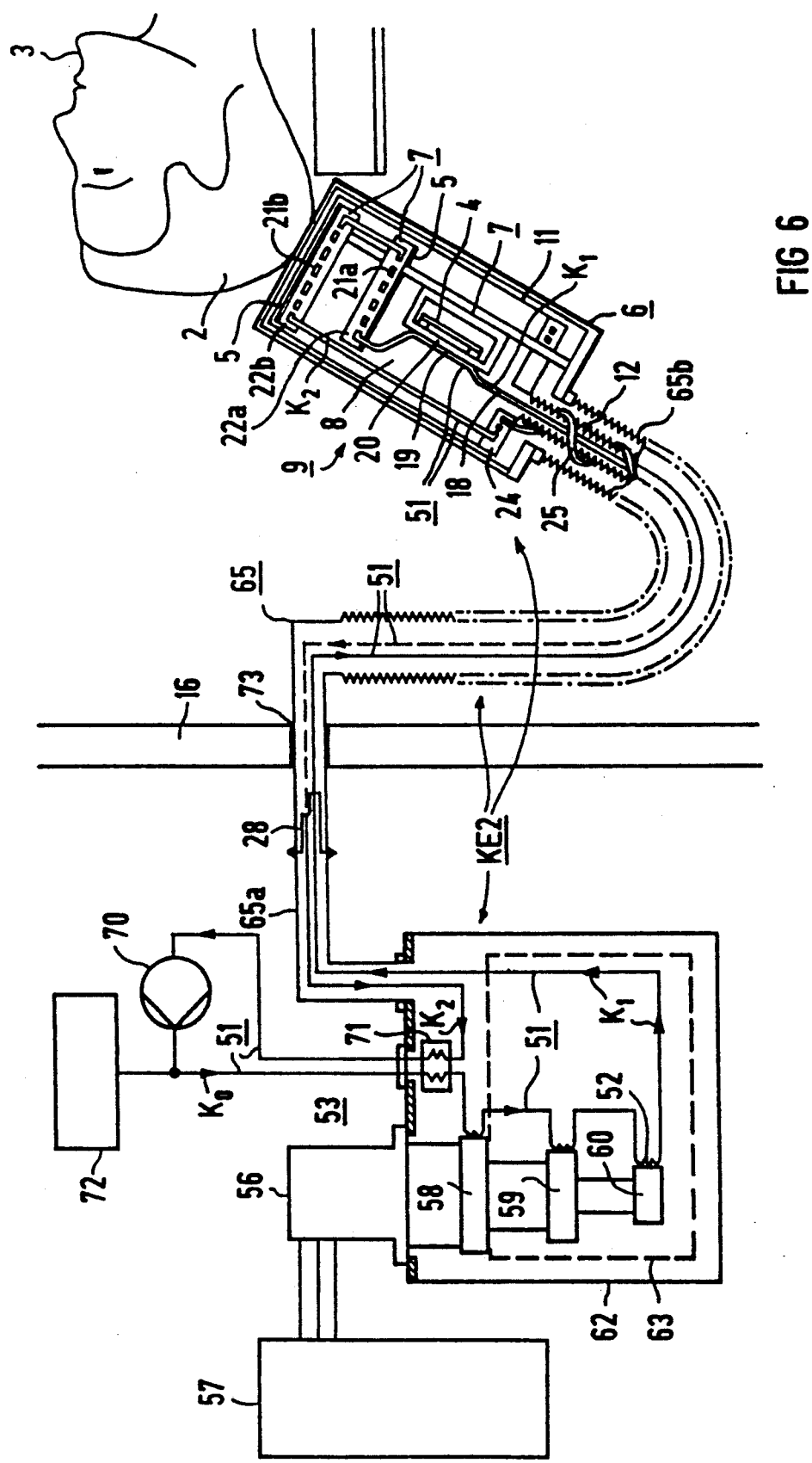

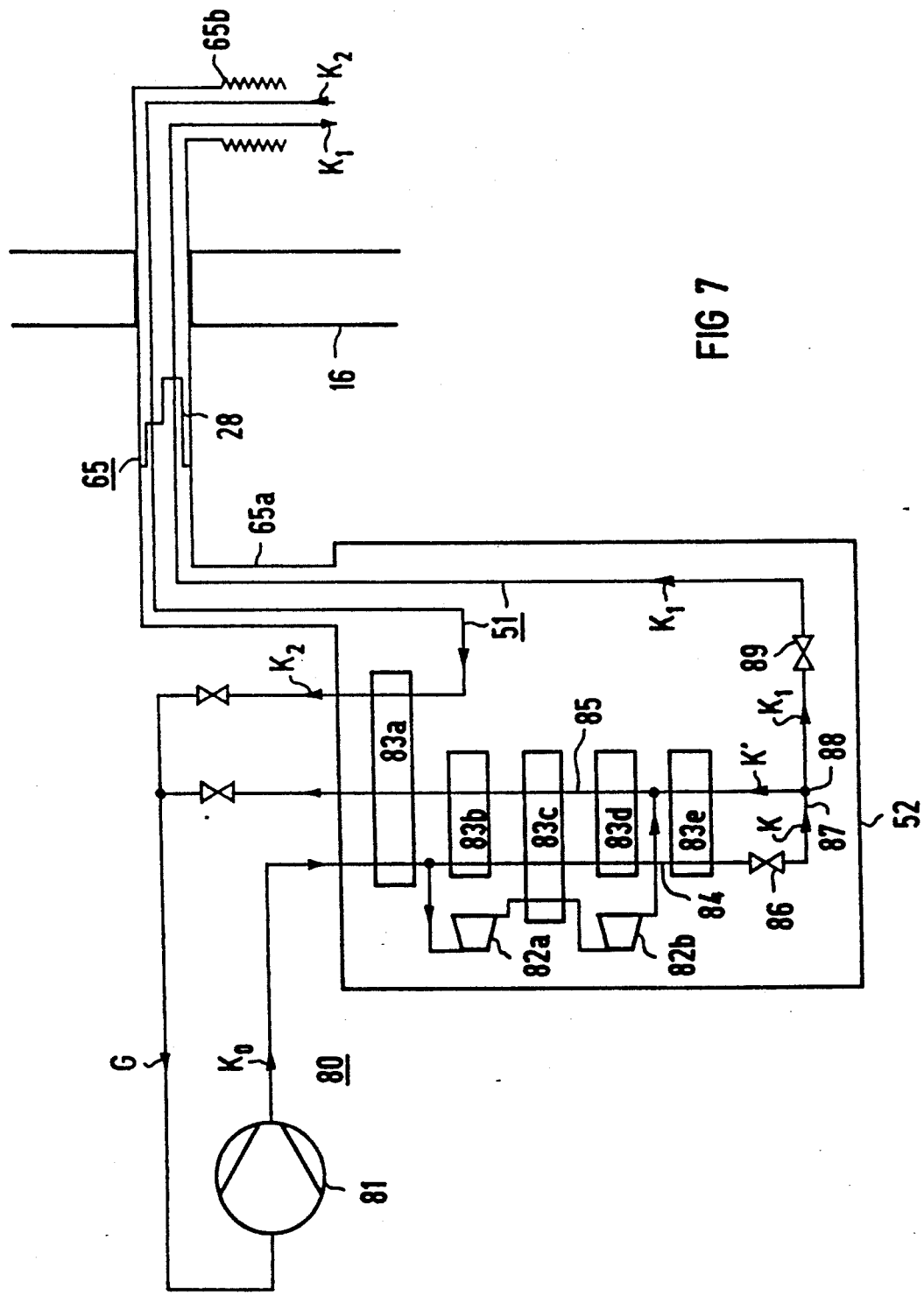

DEVICE FOR COOLING A SQUID MEASURING INSTRUMENT

BACKGROUND OF THE INVENTION

The invention relates generally to a device for cooling and more particularly to a device for cooling a SQUID measuring instrument that measures biomagnetic or other weak magnetic fields.

Such cooling devices include a cryostat containing a vacuum in its interior space. At least one superconducting gradiometer, as well as at least one associated SQUID, are located in the interior space and are thermally coupled via heat-conducting connections to a cryogen (i.e. a cooling medium) that is supplied from outside the cryostat. This type of cooling device is disclosed in U.S. Pat. No. 4,827,217, for example.

Superconducting quantum interferometers, so called "SQUIDs", measure very weak magnetic fields (see, for example, J. Phys.E.: Sci. Instrum., vol. 13, 1980, pp 801 to 813 or IEEE Trans. Electron Dev., vol. ED-27, no. 10, October 1980, pp 1896 to 1908). In the field of diagnostic medicine, magnetocardiography and magnetoencephalography are examples of areas in which these interferometers can be used. In this regard, the magnetic fields produced by heart or brain currents have field strengths on the order of only about 50 pT or 0.1 pT (see, for example, "Biomagnetism—Proceedings Third International Workshop on Biomagnetism, Berlin 1980", Berlin/New York 1981, pp 3 to 31). In addition, these very weak fields, or their field gradients, must be detectable even in the presence of relatively large interference fields. To measure biomagnetic fields of such an order of magnitude, measuring instruments are known that have a single-channel or multi-channel design (see, for example, EP-B-0 111 827). These measuring instruments contain a number of SQUIDs and magnetometers or gradiometers for receiving the field signals to be detected which correspond to the number of channels. Unlike the gradiometers, the magnetometers have only a single detecting loop and can therefore be regarded as gradiometers of zeroth order. Therefore, the term "gradiometer" as used below will generally include magnetometers as well as gradiometers.

Known SQUID measuring instruments, which are also called SQUID magnetometers, have cryostats accommodating the superconducting gradiometers and the SQUIDS. However these cryostats are generally arranged above the field source of a patient to be examined. If the filling capacity of a cryostat is assumed to be about 15 to 30 liters of a cryogenic fluid such as liquid helium (LHe), which is typical for multi-channel measuring instruments with sufficiently large refill intervals, for example, then this cryostat configuration can endanger the patient who is positioned directly below it. If the vacuum insulation were to suddenly collapse or if the cryostat were suddenly damaged and the safety valves blew, a dangerous amount of cold gas would flow onto the patient. Thus, in such an emergency, the 15 to 30 liters of liquid helium would produce about 10 to 30 $m^3$ of cold helium gas. This cold gas cannot realistically be kept away from the patient, particularly when the examination is taking place in a screening booth. Moreover, the patient may consider the positioning of relatively large cryostats over his head unpleasant.

In the cooling device for a SQUID measuring instrument disclosed in U.S. Pat. No. 4,827,217, a considerable quantity of a cryogen in a cryostat is positioned above the patient. The cryogen is located in a separate supply tank inside the cryostat. A SQUID and the associated superconducting coils of the gradiometer are configured in a vacuum space within the cryostat located below the supply tank and are thermally coupled, via parts made of good heat-conducting material, to the supply tank and consequently to the cryogen contained therein. However, the cryostat in this known cooling device, which indirectly cools the superconducting parts of the SQUID measuring instrument, is very costly to construct because of its large dimensions due to the amount of cryogen required.

WO-A-85/04489 also discloses a device for indirectly cooling a SQUID measuring instrument. In this known instrument, it is possible to position the cryostats on one side of the field source to be detected.

A cooling device for a SQUID measuring instrument, whose cryostat can be positioned on one side or below a patient, can be inferred from the publication CRYOSQUID—Proc. of 5th Cryocooler Conference (Cryocoolers 5), Monterey, U.S., 1988, pp 35 to 46. This cooling device cools the superconducting parts by a combination of an LHe bath and numerous He gas currents. The SQUIDs are cooled by an insert element filled with LHe, while the gradiometers are cooled by exhaust gas. The refill interval is about one day. The abovementioned safety problems are negligible in this known cooling device since the position of the cryostat is predetermined. Furthermore, only a relatively small LHe supply is required. However, the refill interval is relatively short. To refill the cryostat, an LHe transport container is brought at least once a day into the screening booth in which the SQUID measuring instrument is situated. In addition, subdividing the gas current into several shunted circuits causes problems for the various gradiometers. Moreover, there is no temperature regulation and it is hardly possible to provide one. Also, it is not possible to adjust the LHe vaporization rate without the application of additional measures. As with a LHe cooling bath, a cold, helium, vacuum-tight cryostat receptacle is needed.

Up until now, the superconducting parts of known SQUID measuring instruments, particularly the SQUIDs, were not cooled with refrigeration machines. Because of their electromagnetic radiation, moving magnetic parts, and vibrations, these machines can generate magnetic interference, which are directly or indirectly detected by the SQUID measuring instrument. For these reasons, refrigeration machines were absolutely avoided. Small refrigeration machines having an adequate refrigeration capability and an operating temperature of under 6K are generally known. They operate according to the so-called Linde-Claude principle (see, for example "Linde Reports from Technology and Science", No. 64: *The Linde Refrigerator for Nuclear Spintomography*, 1990, pp 38 to 45). Additionally, a combination of a two-stage Gifford-McMahon (GM) refrigerator for the temperature range above 10K with a Joule Thomson (JT) cycle can also be used (see the above-mentioned passage from Cryocoolers 5).

Refrigerators that can cool to a temperature of about 4K using the GM principle are also known. To accomplish this, special magnetic materials, such as $Gd_xEr_{1-x}Rh$ are used as regenerators. Due to a magnetic phase transition that occurs even below 10K, these special magnetic materials have a considerable specific heat (see, for example, Adv. Cryog. Engng., vol. 35 b, 1990, pp 1251 to 1260). Besides the direct coupling of a refrigeration machine and a SQUID measuring instrument, (as pointed out in the above-mentioned text passage from *Cryocoolers* 5) other methods of thermally coupling devices requiring very low temperatures to refrigeration machines are known from the field of superconducting magnets (see, for example, *Cryogenics*, vol. 24, 1984, pp 175 to 178).

The problem with the prior art is that there is no cooling device with the features mentioned above that can be configured so that the cryostat does not adversely affect the field source to be detected. More specifically, the cryostat should not endanger a patient. Therefore, there should only be a relatively small amount of cryogen in the vicinity of the field source, allowing the cryostat to have appropriately small dimensions.

SUMMARY OF THE INVENTION

The present invention provides a device for cooling a SQUID measuring instrument for measuring biomagnetic or other weak magnetic fields that includes a cryostat containing a vacuum in an interior space. At least one superconducting gradiometer and at least one associated SQUID are disposed in the vacuum. Heat-conducting connections thermally couple the superconducting gradiometer and the associated SQUID to a cryogen supplied from outside the cryostat. A carrier structure supports the SQUID and the gradiometer. The carrier structure has cooling channels through which the cryogen is forced. A cryogen supply unit is situated outside the cryostat and a cryogen transfer line couples the cryogen supply unit to the cooling channels.

Some of the advantages resulting from the cooling device of the invention can be seen by noting that the cryostat accommodating the measuring system does not require a special cryogen supply and can therefore be relatively small. Furthermore, the cryostat essentially can be aligned in any position within the available space. Since there is only a very small quantity of cryogen in the measuring system, as well as inside an optional screening booth, virtually no safety problems exist. The cryogen only flows inside the cooling channels, which must be designed to be helium- and vacuum-tight.

The known devices require that a special helium tank be placed inside the cryostat. As a result, there is an increased distance between the gradiometers and each field source to be detected. The cooling device of the invention eliminates this special helium tank and thus the gradiometers can be advantageously placed relatively close to the field source so that the sensitivity of the device is increased.

BRIEF DESCRIPTION OF THE DRAWINGS

FIG. 6 schematically illustrates an alternative embodiment of the cooling device of the invention that uses a refrigeration machine; and FIG. 7 schematically illustrates another alternative embodiment of the invention that uses a refrigeration machine different from that used in FIG. 6.

DETAILED DESCRIPTION

Figure 1:
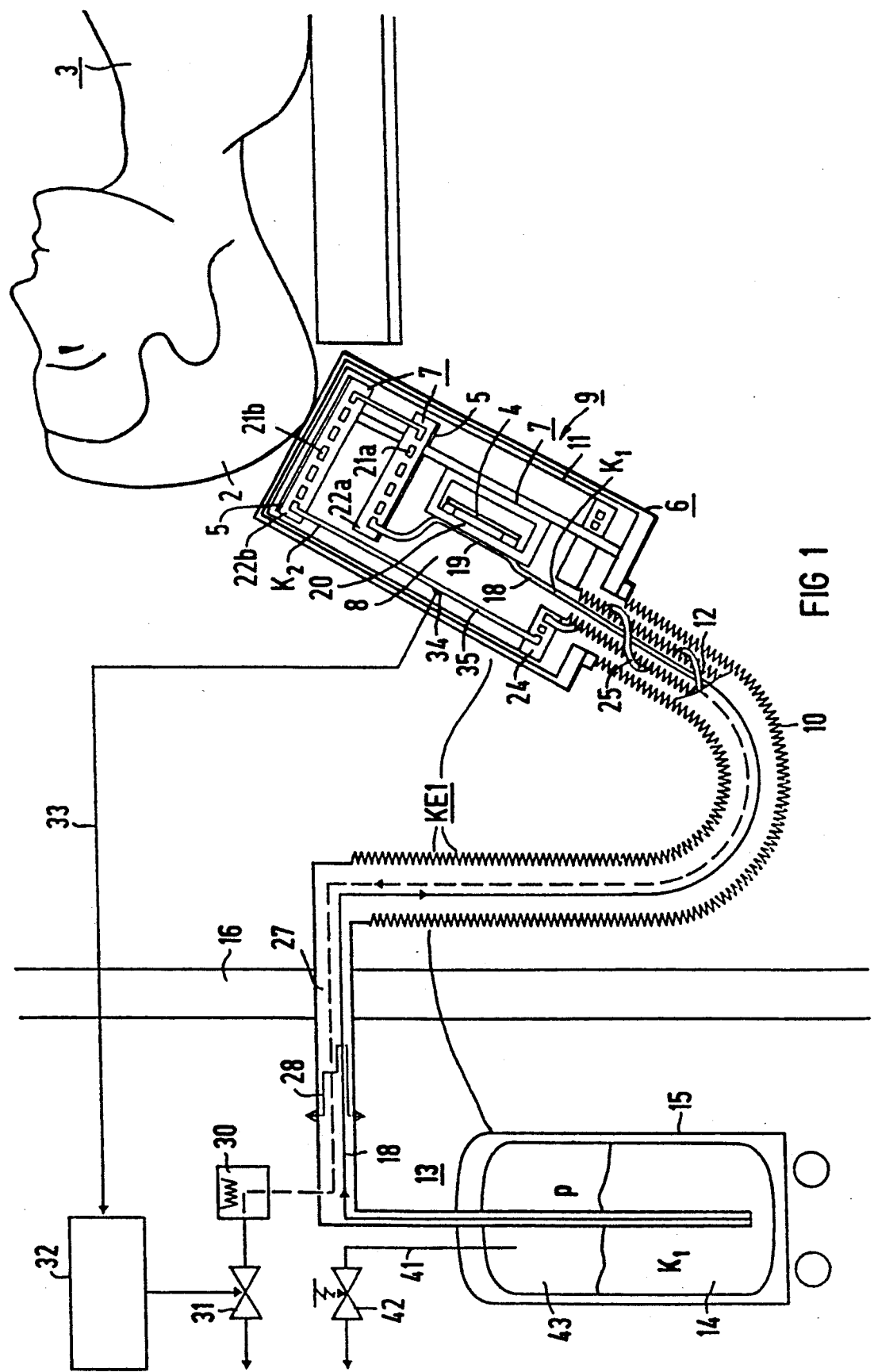
FIG. 1 schematically illustrates a cooling device with a cryogen tank constructed according to the principles of the invention.

SQUID measuring instruments generally detect extremely weak magnetic signals (magnetic fluxes or field gradients) from any field source. A biomagnetic field source 2, such as the brain of a patient 3, is used as an example of a field source in FIG. 1, although other non-biomagnetic field sources may be detected as well. Such SQUID measuring instruments can have a single- or multi-channel design To detect magnetic signals emanating from the field source 2, the instruments contain at least one magnetometer considered to be an antenna, or a gradiometer having one or several superconducting coils (loops). The detected signals are then fed via superconducting connecting leads to a number of SQUIDs corresponding to the number of channels. The SQUIDs can also be directly integrated in the gradiometer coils, so that special connecting leads are eliminated. An electronics system is connected as an outgoing circuit to the SQUIDs, which can be optionally combined to form an array, in the same manner as the gradiometer coils. These known components are not shown in greater detail in the drawing. The magnetic-field-sensitive parts of the SQUID measuring instrument can be accommodated in a screening booth 16, particularly when used for a biomagnetic diagnosis.

A cooling device KE1 is illustrated in the schematic, longitudinal sectional view of FIG. 1. The cooling device KE1 maintains the SQUIDs 4 and gradiometers 5 of a SQUID measuring instrument 9, which are only shown schematically in the figure, at their cryogenic operating temperature. To accomplish this, the SQUIDs 4 and gradiometers 5 are configured on a special carrier structure 7 within a cryostat 6 and are surrounded by an insulating vacuum 8. They are cooled only indirectly through heat conduction. The cryogen $K_1$ required for the cooling may be, for example, liquid helium (LHe) or a two-phase liquid-gas-helium mixture. The cryogen $K_1$ is directed through a flexible cryogen transfer line 10 to the carrier structure 7 that is to be cooled. It is advantageous if the cryogenic fluid $K_1$ is completely vaporized therein. As the fluid is conducted, the now gaseous cryogen $K_2$ cools other parts of the carrier structure 7 and at least one radiation shield 11 in the cryostat 6, as well as one radiation shield 12 in the transfer line 10.

The cryogenic fluid $K_1$ is taken from a cryogen supply unit 13, which has a cryogen tank 15 containing a supply 14 of the cryogen. This tank 15 can be constructed in any well known manner as a supply and transport vessel and is advantageously configured outside of the screening booth 16, which is indicated in FIG. 1 by a section of a wall. As the cryogen $K_1$ is conducted out of the supply and transport vessel 15, it flows through an LHe inflow line 18 in the transfer line 10 and into the cryostat 6, where it arrives in a cooling channel 19. This cooling channel 19 is connected in a heat-conducting manner to one part of the carrier structure 7 which accommodates the SQUIDs 4. As one example, this part of the carrier structure may be a metallic screening box 20 surrounding the SQUIDs 4 onto which the cooling channel 19 is soldered. The SQUIDs 4 are then thermally coupled to this box 20.

After the indirect cooling of the SQUIDs 4, the cryogen $K_1$, which may already be partially vaporized, arrives in the cooling channels 21a and 21b. These cooling channels are integrated in the part of the carrier structure 7 which accommodates the gradiometers 5. This part of the carrier structure may be designed as so-called cooling plates 22a or 22b that are made of plastic. One of the cooling plates is illustrated in more detail in FIGS. 4 and 5. Next, the cryogen $K_2$, which by this time is at least substantially gaseous, flows through other structural parts 24, to which the radiation shield 11 of the cryostat 6 is thermally coupled. The cryogen $K_2$ is then conducted to an exhaust-gas line 25 of the transfer line 10, which is thermally connected to the radiation shield 12 of the transfer line and which is therefore cooled by the exhaust gas.

The transfer line 10 also includes a segment, designed as a bushing 27, which runs through the wall of the screening booth 16. Since, apart from this bushing 27, the transfer line may have a flexible design, at least within the partial segments of its length, the cryostat 6 can be advantageously mounted in many alternate positions. Thus it is possible to have a configuration wherein the cryostat 6 is positioned both above as well as below the patient 3. To replace the cooling-medium, supply, and transport vessel 15, the transfer line 10 can be separated from the vessel 15 at a disconnecting point 28 in any known manner.

Furthermore, as schematically indicated in FIG. 1, the gaseous cryogen $K_2$ conducted from the screening booth 16 via the transfer line 10 can, if desired, be heated by a preheater 30 to a higher temperature such as room temperature. The exhaust gas is then lead off via a regulating valve 31, which is controlled by an automatic controller 32, and collected in a receptacle (not shown) or in any other manner.

The automatic controller 32 receives its control signals via a control line 33 from a temperature sensor 34. This temperature sensor 34 is mounted in the cryostat 6 on the part 35 of the cryogen line which is arranged downstream from the cooling channels 21a and 21b. By measuring the cryogen temperature at this location it is assured that the SQUIDs 4 and gradiometers 5 are each maintained in their superconducting operating state, and are thus at a temperature significantly below their respective superconducting transition temperatures.

Figure 2:
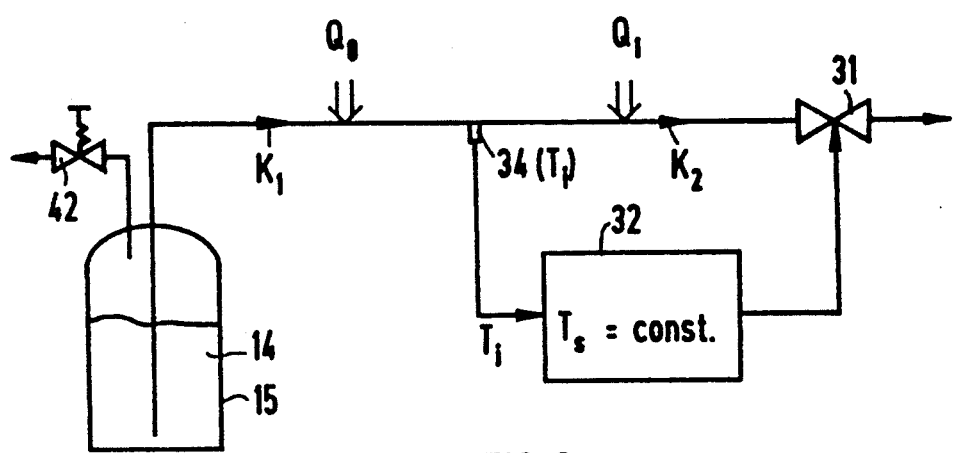
FIGS. 2 and 3 schematically illustrate systems for regulating the cryogen flow in the cryogen lines of the cooling device shown in FIG. 1.

The entire cryogen flow can be controlled with the aid of the regulating valve 31 that is disposed at the outlet of the cryogen line outside the cryostat 6. This automatic controlling system is sketched in FIG. 2. The automatic controller 32 controls the regulating valve 31 as a function of the actual temperature $T_i$ measured by the temperature sensor 34 so that a specified, at least substantially constant setpoint temperature $T_s$ of the gaseous cryogen $K_2$ results at the measuring point of the temperature sensor. As seen in FIG. 2, the quantity of heat transferred to the cryogen $K_1$ in the transfer line 10 as well as in the carrier structure 7 is denoted by $Q_o$ and illustrated by an arrow. Also, the quantity of heat introduced into the gaseous cryogen $K_2$ downstream from the temperature sensor 34 by the radiation shields 11 and 12 and possibly by the preheater 30 is denoted by the arrow $Q_1$.

Figure 3:
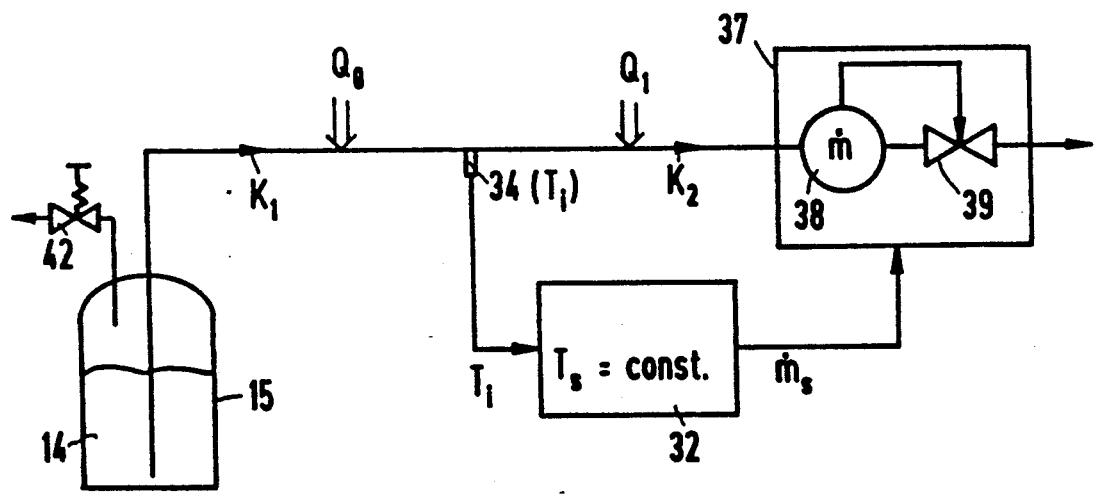

To improve the controller performance, the automatic control mechanism may be, if desired, a so-called cascade control as shown in FIG. 3, for which a representation corresponding to FIG. 2 is illustrated. If the cascade control is used, a mass-flow controller 37 is utilized in place of the regulating valve 31 depicted in FIGS. 1 and 2. Mass-flow controllers suitable for this purpose are generally known and comprise a device 38 for measuring the mass flow rate $\dot{m}$ as well as a controllable valve 39. The mass-flow setpoint value $\dot{m}_s$ can be controlled by the automatic controller 32 as a function of the actual temperature $T_i$ measured by the temperature sensor 34.

FIGS. 1 to 3 indicate that an excess pressure p is a prerequisite for the forced cooling used in the cooling device according to the present invention. This excess pressure p, which is supposed to prevail particularly in the cooling-medium tank 15, may be, for example, within a pressure range of 100 to 500 mbar. To maintain this pressure, a pressure-keeping valve 42 is installed in the path of the exhaust gas flow 41 of the tank 15. This pressure-keeping valve 42 maintains the excess pressure p in the exhaust gas space 43 above the supply 14 of cryogenic fluid $K_1$ at a roughly constant value.

Figure 4:
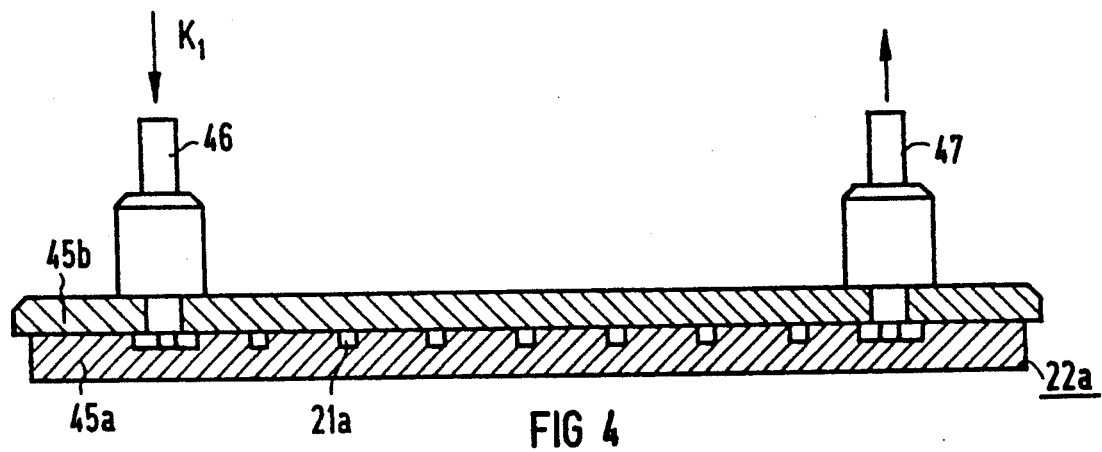
FIG. 4 schematically illustrates a side view of one of the cooling channels.
Figure 5:
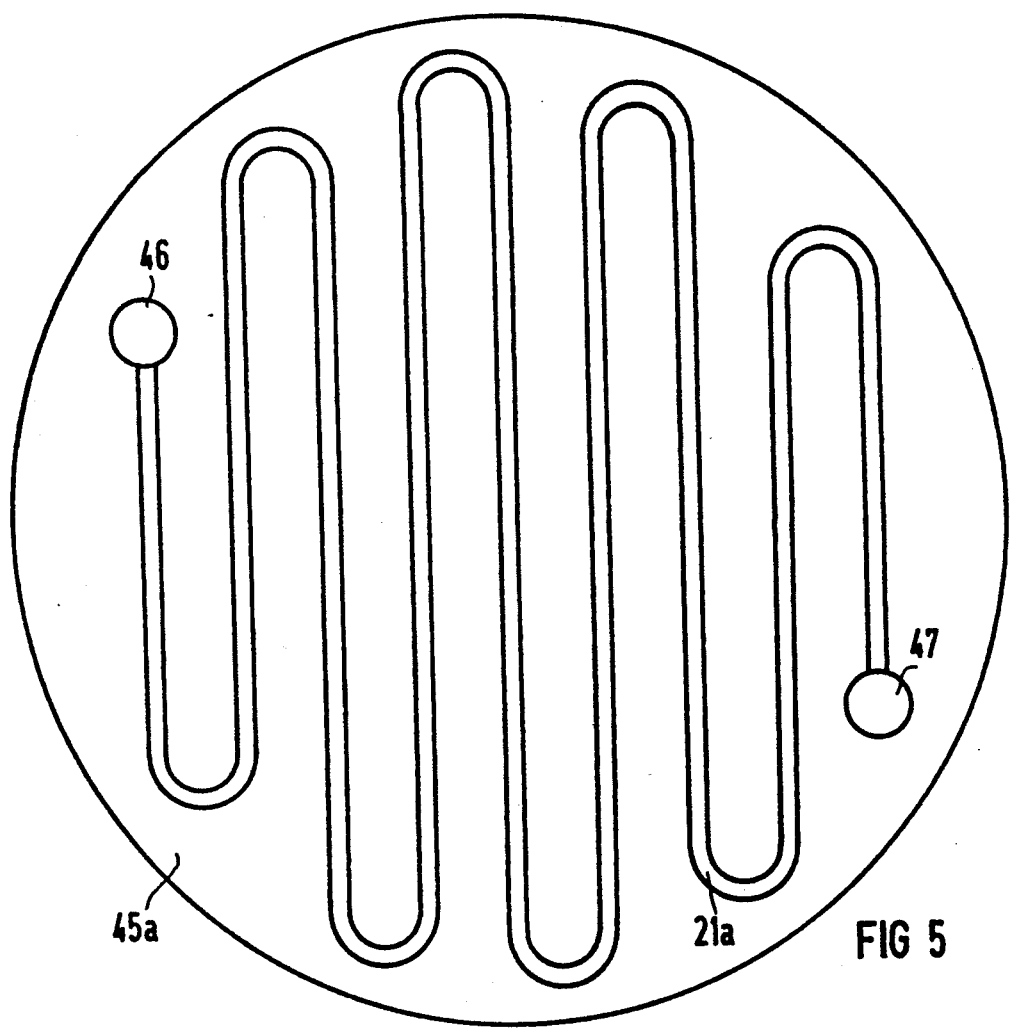
FIG. 5 schematically illustrates a plan view of the cooling channel shown in FIG. 4.

In FIGS. 4 and 5, one of the cooling plates 22a and 22b of the carrier structure 7 (shown only schematically in FIG. 1) is illustrated in greater detail as a lateral or longitudinal section. Each of these similarly constructed cooling plates may be formed from a plastic reinforced with glass fibers, such as epoxy resin, for example. The coils or loops of the gradiometer 5 are applied to these cooling plates by an adhesive or any other means. As seen in FIG. 4, each of the plates can be composed of two contiguously joined plate-shaped elements 45a and 45b. The cooling channel 21a is thus recessed in at least one of these elements, for example in element 45a. The at least partially liquid cryogen $K_1$ flows through this cooling channel from one inlet point 46 to an outlet point 47. As is apparent from FIG. 5, the cooling channel 21a (and therefore also the cooling channel 21b, which is not depicted) can advantageously have a shape that guarantees at least a substantially uniform temperature over the surface of the plate 22a that is to be cooled. Therefore, according to the embodiment of the invention illustrated in FIG. 5, a meander shape is selected for the cooling channel 21a. Sine-shaped or spiral-shaped cooling channels are equally suitable.

Another cooling device according to the present invention, designated generally by KE2 and having a SQUID measuring instrument 9, is illustrated in FIG. 6 as a schematic, longitudinal sectional view. The measuring instrument 9 is designed in accordance with FIGS. 1, 4 and 5. According to this refinement of the cooling device KE2, the liquid and gaseous cryogen $K_1$ and $K_2$ is forcibly conveyed into a hermetically sealed cryogen cycle. The cryogen piping system required for this device KE2 is designated by reference numeral 51. It includes a cold line-mounted part 52, which is cooled by a refrigeration machine 56 located outside of the screening booth 16 to a temperature low enough to liquefy the cryogen $K_1$. In this particular embodiment of the cooling device KE2, the refrigeration machine 56 essentially represents the external cryogen supply unit, generally designated by reference numeral 53. The refrigeration machine 56 selected for this particular embodiment is a Gifford-McMahon (GM) refrigerator. This type of refrigeration machine advantageously has its own condenser (i.e. liquefier) cycle with a compressor unit 57 to condense a medium circulating in the condenser cycle. The medium may advantageously be helium. Since this condenser cycle is independent of the cooling-medium cycle conducted through the piping system 51 and is only thermally coupled thereto, machine vibrations can be effectively eliminated within the cooling-medium cycle. The refrigeration machine 56 comprises two cooling stages 58 and 59 for the temperature range above 10K. An additional cooling stage 60 follows these two stages which can cool to about 4K by utilizing the Joule-Thomson (JT) effect. The cooling stage 60 can therefore also be called a 4-K cooling stage. An example of an appropriate refrigeration machine can be inferred from the above-mentioned passage in Cryocoolers 5 or from the German Patent DE-B-34 27 601. The cooling stages 58 and 60 of the refrigeration machine 56 are situated in a cooling housing 62. In the interior chamber of the housing 62 a subspace is defined by a thermal shield 63 which accommodates the two colder stages 59 and 60 and which is thermally coupled to the first cooling stage 58.

The cryogen $K_1$ liquefied at the 4-K cooling stage 60 of the refrigeration machine 56 is transported out of the housing 62 and conducted into the cryostat 6 of the SQUID measuring instrument 9 via a cryogen transfer line 65 that is at least partially flexible. The cryogen transfer line 65 essentially corresponds to the transfer line 10 shown in FIG. 1.

A circulating pump 70, which is at room temperature, ensures that the forced flow rate in the cryogen piping system 51 is maintained. The gaseous cryogen $K_2$, which is conducted out of the cryostat 6 via the transfer line 65 and is warmed up even further while in this line, is not supplied directly to the circulating pump 70. Rather, the cryogen $K_2$ is advantageously used to precool the cryogen $K_o$, which is still more or less at room temperature and is supplied by the circulating pump 70 to the first stage 58 of the refrigeration machine 56. A heat exchanger 71 provided for this purpose is situated in the cooling housing 62 outside of the subspace defined by the thermal shield 63. To maintain a sufficient quantity of the cryogen $K_o$ in the cooling cycle of the piping system 51, an accumulator 72 coupled to the piping system 51 provides an adequate supply of gaseous cryogen. This gas is still within room temperature range and is downstream from the circulating pump 70 when viewed in the direction of cryogen flow.

It may be realized by examination of FIG. 6 that when a screening booth 16 is present, the transfer line 5 must include a segment which is constructed as a bushing 73 that passes through the wall of the booth 16. In the vicinity of this bushing 73, the individual cryogen lines of the transfer line 65 are electrically insulated. The cooling device KE2 of the cryostat can be advantageously aligned in many positions since, apart from the bushing 73, the transfer line can be flexibly designed, at least within partial segments of its length. The transfer line also may have, for example, a rigid line-mounted part 65a connected to the cooling housing 62 as well as a flexible line-mounted part 65b connected to the cryostat 6. Furthermore, to replace the refrigeration machine 56 for any reason, such as in case of a malfunction or for servicing or to connect an LHe supply tank for an emergency operation, the transfer line 65 can be separated at the coupling 28, which is designed in a known manner.

According to the embodiment of the invention seen in FIG. 6, a three-stage refrigerator including a two-stage GM machine and a subsequent JT stage is advantageously used as a refrigeration machine for a cooling device in the invention. In principle, however, the cooling device can also be constructed with any other type of refrigeration machine that has its own condenser cycle separate from the cryogen cycle, which cools the superconducting parts of the SQUID measuring instrument. The cryogen cycle is thermally coupled to the coldest (4-K) stage of the condenser cycle. Thus, refrigeration machines whose coldest stage is designed as a GM stage may also be used. Moreover, a refrigeration machine which works according to the Linde Claude principle may also be used (compare "E and M", 90 Jg., 1973, pp 218 to 224). A refrigeration machine corresponding to those above is indicated in FIG. 7 and designated by reference numeral 80. This figure only shows the refrigeration machine 80 and a part of a cryogen transfer line 65. The parts of the SQUID measuring instrument which are not depicted correspond to those seen in FIG. 1 or FIG. 6. The refrigeration machine 80 includes one compressor 81, two expansion turbines 82a arranged one behind the other, five counter-current (flow), heat exchangers 83a to 83e, as well as one cryogen high-pressure branch 84 and one cryogen low-pressure branch 85 passing through these heat exchangers. A portion of the cryogen $K_o$ compressed by the compressor 81 is conducted from the high-pressure branch 84, expanded by the expansion turbines 82a and 82b and then fed into the low-pressure branch 85. The partial flow remaining in the low-pressure branch is partially liquefied at its extremity by a JT valve 86. The fluid flow K obtained in this manner at this coldest stage of the machine is conveyed via a cold line-mounted part 87 to a flow diverter 88, where it is divided into two partial flows K' and $K_1$. In accordance with FIG. 6, the partial flow $K_1$ serves to cool the superconducting parts of a SQUID measuring instrument 9. The quantity of cryogen contained in the partial flow $K_1$ is adjusted by a valve 89. After the other partial flow K' passes through the heat exchangers 83e to 83a of the low-pressure branch 85, during which it is vaporized, the partial flow forms a shared cryogenic gas flow G together with gaseous cryogen $K_2$ returning from the SQUID measuring instrument via the transfer line 65. This gas flow is then supplied to the compressor 81. This type of refrigeration machine 80 therefore represents an integrated part of the cryogen piping system 51 of a cooling device KE2 according to the invention. Problems resulting from vibrations are not a concern because the vibrations produced by a condenser cycle with turbines utilizing the Linde Claude principle are minimal.

By using the cooling devices seen in FIGS. 6 and 7, the cooling device of the present invention permits the continuous operation of a SQUID measuring instrument wherein the temperature of all the superconducting parts must be kept below their respective superconducting transition temperatures, which may, for example, be below 6K. Further, vibrations can be prevented from being transferred to the SQUID measuring instrument. The superconducting components can be designed as a compact measuring system arranged in an appropriately small cryostat which can be orientated as needed. If necessary, the bushing that runs through the wall of the screening booth can be electrically isolated, thereby providing, for example, isolation between electrically conductive parts that are outside and inside the screening booth.

What is claimed is:

1. A device for cooling a SQUID (superconducting quantum interferometer device) measuring instrument for measuring biomagnetic or other weak magnetic fields comprising:

a cryostat having a vacuum in an interior space;

at least one superconducting gradiometer and at least one associated SQUID disposed in the vacuum of said cryostat;

heat-conducting connections thermally coupling said at least one superconducting gradiometer and said at least one associated SQUID to a cryogen supplied from outside said cryostat;

a carrier structure supporting said at least one SQUID and said at least one gradiometer, said carrier structure including cooling channels through which the cryogen is forced for cooling said at least one SQUID and said at least one gradiometer;

a cryogen supply unit situated outside the cryostat; and a cryogen transfer line coupling said cryogen supply unit to said cooling channels.

2. The cooling device of claim 1 wherein said carrier structure contains cooling plates accommodating the gradiometer, said cooling channels being integrated in said cooling plates.

3. The cooling device of claim 2 wherein each of said cooling plates comprises two plate-shaped elements, one of said cooling channels being recessed in one of the plate-shaped elements.

4. The cooling device of claim 3 wherein said cooling channel in the plate-shaped element of the cooling plate has a meander shape.

5. The cooling device of claim 2 wherein said cooling plates are formed from a plastic reinforced with glass fibers.

6. The cooling device of claim 1 wherein said carrier structure accommodating said SQUID contains a metallic screening box thermally coupled to one of said cooling channels and to said SQUID.

7. The cooling device of claim 5 wherein said carrier structure accommodating said SQUID contains a metallic screening box thermally coupled to one of said cooling channels and to said SQUID.

8. The cooling device of claim 1 further comprising a first thermal radiation shield disposed in said cryostat and a second thermal radiation shield disposed in said cryogen transfer line, said radiation shields thermally coupled to gaseous cryogen.

9. The cooling device of claim 1 further comprising a screening booth, said cryostat being disposed inside said screening booth and said cryogen supply unit being disposed outside of said screening booth.

10. The cooling device of claim 8 further comprising a screening booth, said cryostat being disposed inside said screening booth and said cryogen supply unit being disposed outside of said screening booth.

11. The cooling device of claim 1 wherein said cryogen transfer line is at least partially flexible.

12. The cooling device of claim 11 wherein said cryogen supply unit includes a cryogen tank.

13. The cooling device according to claim 12 wherein said cryogen tank has an exhaust gas chamber in which an excess pressure is formed, the excess pressure forcibly conducting the cryogen through the cooling channels of the carrier structure.

14. The cooling device of claim 12 further comprising:

a regulating valve disposed outside of the cryostat, at an outlet of an exhaust-gas line to control the flow of cryogen through the cooling channels of the carrier structure;

an automatic controller controlling said regulating valve as a function of temperature;

a temperature sensor measuring the temperature; and a cryogen piping segment conveying gaseous cryogen and disposed downstream from the cooling channels of the carrier structure, said temperature sensor being mounted on said cryogen piping segment.

15. The cooling device of claim 13 further comprising:

a regulating valve disposed outside of the cryostat, at an outlet of an exhaust-gas line to control the flow of cryogen through the cooling channels of the carrier structure;

an automatic controller controlling said regulating valve as a function of temperature;

a temperature sensor measuring the temperature; and a cryogen piping segment conveying gaseous cryogen and disposed downstream from the cooling channels of the carrier structure, said temperature sensor being mounted on said cryogen piping segment.

16. The cooling device of claim 14 further comprising a mass-flow controller that includes said regulating valve.

17. The cooling device of claim 1 wherein said cryogen supply unit is a refrigeration machine forcibly conveying the cryogen in a closed cryogen cycle and further comprising a cryogen piping system having a cold piping section coupled to a coldest stage of the refrigeration machine, said cooling channels of the carrier structure being coupled to the cold piping section via the cryogen transfer line.

18. The cooling device of claim 6 wherein said cryogen supply unit is a refrigeration machine forcibly conveying the cryogen in a closed cryogen cycle and further comprising a cryogen piping system having a cold piping section coupled to a coldest stage of the refrigeration machine, said cooling channels of the carrier structure being coupled to the cold piping section via the cryogen transfer line.

19. The cooling device of claim 11 wherein said cryogen supply unit is a refrigeration machine forcibly conveying the cryogen in a closed cryogen cycle and further comprising a cryogen piping system having a cold piping section coupled to a coldest stage of the refrigeration machine, said cooling channels of the carrier structure being coupled to the cold piping section via the cryogen transfer line.

20. The cooling device of claim 17 further comprising a pump forcibly conveying the cryogen through the cryogen piping system.

21. The cooling device of claim 20 wherein the cryogen in the cold piping section is thermally coupled to the coldest stage of the refrigeration machine.

22. The cooling device of claim 17 wherein said refrigeration machine has a series of cooling stages operating according to the Gifford McMahon principle.

23. The cooling device of claim 21 wherein said refrigeration machine has a series of cooling stages operating according to the Gifford McMahon principle.

24. The cooling device of claim 22 wherein said series of cooling stages includes said coldest stage that is a Joule Thomson stage.

25. The cooling device of claim 17 wherein the refrigeration machine includes a condenser cycle integrated, at least in the vicinity of the cold piping section, with the cryogen cycle to cool said at least one SQUID and said at least one gradiometer.

26. The cooling device of claim 22 wherein the refrigeration machine includes a condenser cycle integrated, at least in the vicinity of the cold piping section, with the cryogen cycle to cool said at least one SQUID and said at least one gradiometer.

27. The cooling device of claim 24 wherein the refrigeration machine has a condenser cycle integrated, at least in the vicinity of the cold piping section, with the cryogen cycle to cool said at least one SQUID and said at least one gradiometer.

28. The cooling device of claim 17 wherein said refrigeration machine is a Linde Claude refrigeration machine.

29. The cooling device of claim 21 wherein said refrigeration machine is a Linde Claude refrigeration machine.

30. The cooling device of claim 25 wherein said refrigeration machine is a Linde Claude refrigeration machine.

* * * * *